(12) United States Patent
Schmidt

(10) Patent No.: US 9,877,326 B2
(45) Date of Patent: Jan. 23, 2018

(54) MEASURING DEVICE AND A MEASURING METHOD FOR DETERMINING AN ACTIVE CHANNEL

(71) Applicant: Rohde & Schwarz GmbH & Co. KG, Munich (DE)

(72) Inventor: Stefan Schmidt, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 14/759,578

(22) PCT Filed: Jul. 30, 2014

(86) PCT No.: PCT/EP2014/066347
§ 371 (c)(1),
(2) Date: Jul. 7, 2015

(87) PCT Pub. No.: WO2015/014881
PCT Pub. Date: Feb. 5, 2015

(65) Prior Publication Data
US 2015/0351097 A1   Dec. 3, 2015

(30) Foreign Application Priority Data

Jul. 30, 2013 (DE) .................. 10 2013 214 822
Sep. 5, 2013 (DE) .................. 10 2013 217 707

(51) Int. Cl.
| | |
|---|---|
| H04W 72/04 | (2009.01) |
| H04L 5/14 | (2006.01) |
| H04N 21/438 | (2011.01) |
| H04N 21/442 | (2011.01) |
| H03J 1/00 | (2006.01) |

(52) U.S. Cl.
CPC ....... *H04W 72/0453* (2013.01); *H03J 1/0008* (2013.01); *H04L 5/14* (2013.01); *H04N 21/4383* (2013.01); *H04N 21/44209* (2013.01)

(58) Field of Classification Search
CPC . H04W 72/0453; H04W 72/04; H03J 1/0008; H04L 5/14; H04N 21/4383; H04N 21/44209
USPC ................................ 370/252, 331, 498, 329
See application file for complete search history.

(56) References Cited

U.S. PATENT DOCUMENTS

| | | |
|---|---|---|
| 5,371,550 A | 12/1994 | Shibutani et al. |
| 2005/0078225 A1 | 4/2005 | Yen |
| 2006/0037059 A1 | 2/2006 | Jin |

(Continued)

FOREIGN PATENT DOCUMENTS

| | | |
|---|---|---|
| DE | 3521996 C1 | 5/1990 |
| WO | 2007/050198 A1 | 5/2007 |

*Primary Examiner* — Kwang B Yao
*Assistant Examiner* — Syed Bokhari
(74) *Attorney, Agent, or Firm* — Ditthavong & Steiner, P.C.

(57) ABSTRACT

A measuring device serves to determine an active channel from a plurality of channels of known frequencies. In this context, it comprises a processor (11) which, in turn, comprises a transform unit (20). This transform unit (20) is embodied to transform the signal which contains the active channel or a signal (30) derived from this signal into a signal in the frequency domain (31). The processor (11) further contains a detection unit (28), which is embodied to detect the active channel in the signal in the frequency domain (31).

6 Claims, 3 Drawing Sheets

(56) References Cited

U.S. PATENT DOCUMENTS

| | | | |
|---|---|---|---|
| 2008/0125071 A1 | 5/2008 | Maeda et al. | |
| 2010/0158050 A1* | 6/2010 | Yang | H04L 27/2647 370/498 |
| 2012/0294168 A1* | 11/2012 | Freda | H04B 1/0067 370/252 |
| 2015/0055627 A1* | 2/2015 | Robbins | H04W 36/0094 370/331 |

* cited by examiner

MEASURING DEVICE AND A MEASURING METHOD FOR DETERMINING AN ACTIVE CHANNEL

CROSS-REFERENCE TO RELATED APPLICATION

The present application a national phase application of PCT Application No. PCT/EP2014/066347, filed Jul. 30, 2014, and claims priority to German Patent Application 10 2013 214 822.4 filed on Jul. 30, 2013 and German Patent Applications 10 2013 217 707.0 filed on Sep. 5, 2013, the entire contents of which are herein incorporated by reference.

FIELD OF THE INVENTION

The present invention, according to various embodiments described herein, relates to a measuring device and a measuring method for determining an active channel among a plurality of channels of known frequencies, especially an LTE TDD PRACH channel.

BACKGROUND OF THE INVENTION

To determine an active channel among several possible channels, each possible individual channel is conventionally adjusted in succession, and it is then determined whether a signal is to be received on the respective channel. For example, a television receiver in which active channels are determined on the basis of a channel-search routine. Such methods are disadvantageous because they require a time-consuming fine tuning of the reception to every individual one of the channels.

SUMMARY OF THE INVENTION

The application provides a measuring device and a measuring method which can determine an active channel among a plurality of channels of known frequencies without requiring a large expenditure of time.

The measuring device according to the embodiments of the invention may determine an active channel from a plurality of channels of known frequencies. In this context, it may comprise a processor which, in turn, may comprise a transform unit. In this context, the transform unit may be embodied to transform the signal which contains the active channel or a signal derived from this signal into the frequency domain. The processor may further contain a detection unit which may be embodied to detect the active channel in the signal in the frequency domain. Accordingly, it is possible to investigate the entire signal, that is, all channels coming into question, and to determine which channel may be the active channel in a single operation.

By preference, the detection unit further comprises a filter unit which may be embodied to form a moving-average of a signal derived from the signal in the frequency domain. Through formation of the moving-average, the information present in the signal in the frequency domain can be further compressed in a simple manner, so that it may be simpler to evaluate.

By preference, the detection unit further comprises a power-determining unit which may serve to determine the power of the signal in the frequency domain. In this context, the signal processed by the filter unit may be the power of the signal in the frequency domain. Furthermore, as a result of the power determination, it may become simpler to determine the active channel by compressing the information in the signal.

The detection unit may contain a maxima-determining unit which may be embodied to determine a maximum of the moving-average. Accordingly, the actual maximum can be determined in a simple manner.

The detection unit further may contain a channel-determining unit which may be embodied to determine the active channel by means of a value table, on the basis of the frequency indices associated with the determined maxima. Accordingly, the active channel can be determined with a very low computational effort.

Advantageously, the measuring device further comprises a receiver unit which may be embodied to receive and digitise the signal. Accordingly, the entire processing of the signal can take place within the measuring device without further external components.

By preference, the processor may further contain a verification unit which may be embodied to check whether an entire spectrum to be investigated, which has been output by the transform unit, has been investigated, and on this basis, to determine whether the active channel is valid. Accordingly, error outputs which can arise before the entire spectrum has been investigated can be excluded.

The signal is preferably an LTE signal. The active channel may then be an LTE TDD PRACH channel. Accordingly, the measuring device and the measuring method according to the invention can be used to determine the channel on which the LTE TDD PRACH channel is actually transmitted.

By preference, the measuring device further may comprise a memory for the determination of a frequency associated with the determined active channel and an oscillator for the mixing down of the signal or of a signal derived from the signal with an oscillator signal of the frequency associated with the active channel. In this manner, a very simple and high-precision further processing of the signal can be provided.

The measuring method according to one embodiment may serve to determine an active channel from a plurality of channels of known frequencies within one signal. Initially, a transformation into the frequency domain of a digital signal derived from the signal may be implemented. Following this, a detection of the active channel in the signal in the frequency domain may be implemented. Accordingly, the active channel can be determined with a very low computational effort and a very small time expenditure.

BRIEF DESCRIPTION OF THE DRAWINGS

In the following, the invention is described by way of example on the basis of the drawings which present an advantageous exemplary embodiment of the invention. The drawings show.

DETAILED DESCRIPTION OF THE DRAWINGS

Initially, the construction and functioning of the various exemplary embodiments of the measuring device according to the invention will be explained with reference to FIGS. 1-3. On the basis of FIG. 4, the precise functioning of an exemplary embodiment of the measuring method according to the invention will then be described. In some cases, the presentation and description of identical elements in similar drawings has not been repeated.

Figure 1:
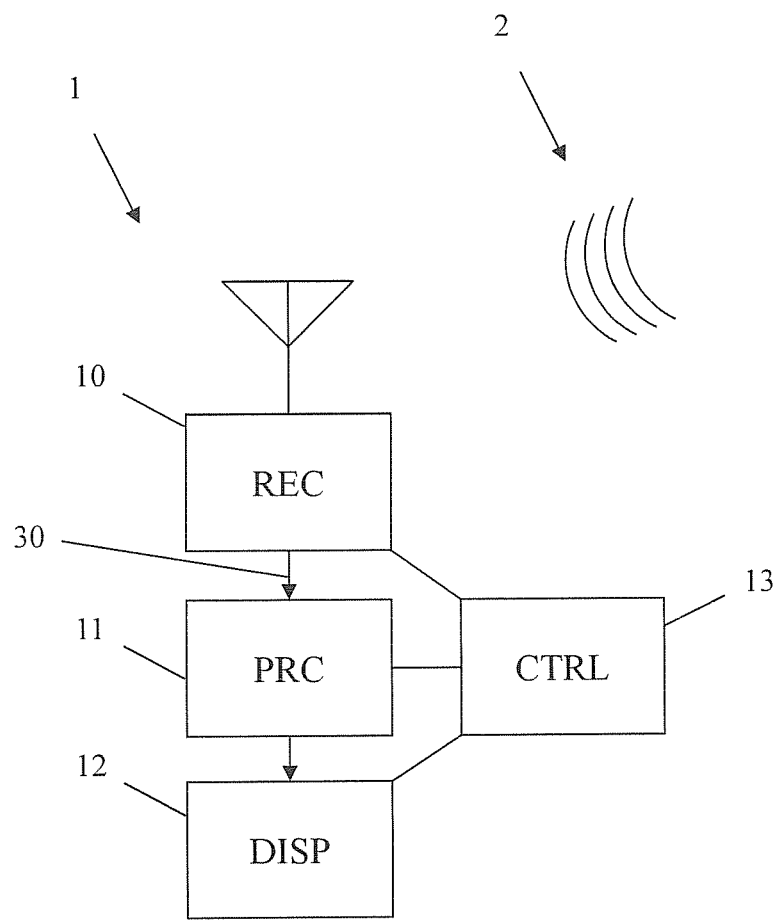
FIG. 1 a first exemplary embodiment of the measuring device according to one embodiment in a block-circuit diagram.

FIG. 1 shows an exemplary embodiment of the measuring device 1 according to the invention. A signal 2 contains Nchannels possible active channels. However, of these, only one single channel is active in the present exemplary embodiment. The measuring device and the measuring method are, however, also capable of detecting several active channels.

The measuring device 1 contains a receiver unit 10, which is connected to a processor 11. This is connected to a display unit 12. Furthermore, the measuring device contains a control unit 13 which is connected to the receiver unit 10, the processor 11 and the display unit 12.

The signal 2 is received and digitised by the receiver unit 10. The digitised signal 30 is rerouted to the processor 11, which is embodied to transform the digitised signal 30 into the frequency domain and to detect the active channel. The precise function of the processor 11 will be described in greater detail with reference to FIG. 2. The active channel is rerouted by the processor 11 to the display unit 12 and displayed by the latter. In this context, the receiver unit 10, the processor 11 and the display unit 12 are controlled by the control unit 13.

Figure 2:
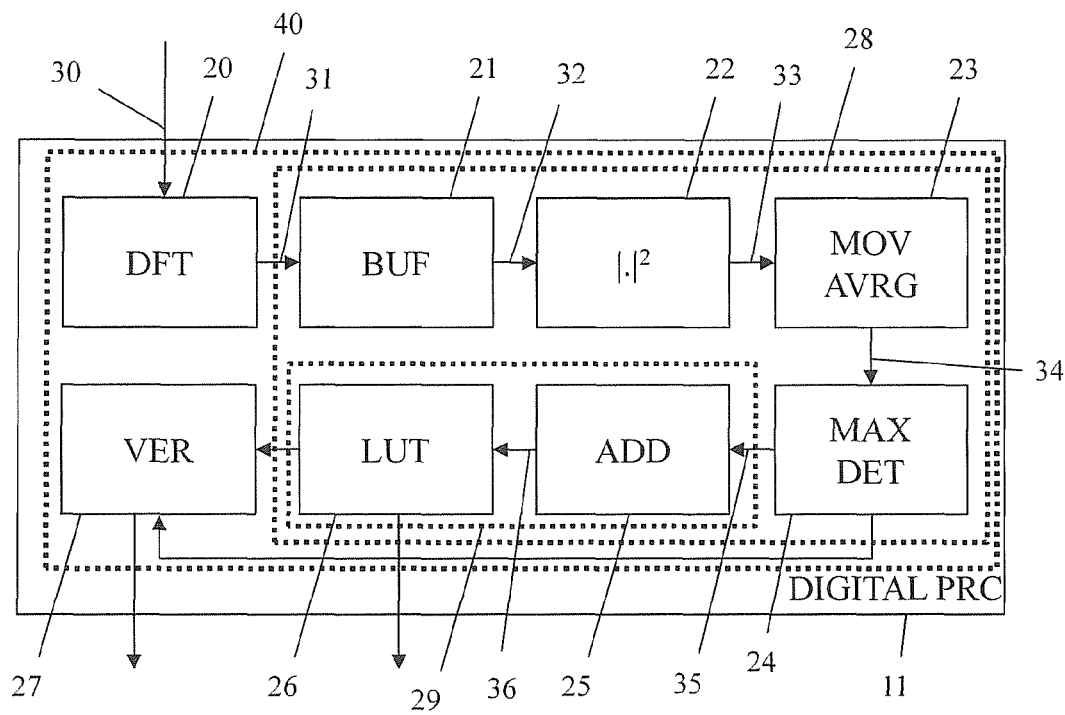
FIG. 2 detail view of the first exemplary embodiment of the measuring device according to one embodiment in a block-circuit diagram.

FIG. 2 shows a detail view of the measuring device 1 according to the invention from FIG. 1. Only the processor 11 is displayed here. A presentation of components of the processor 11 not essential to the invention has not been provided here for reasons of clarity. Accordingly, not all of the components necessary for receiving and processing the signal have been presented in detail.

The processor 11 contains a transform unit 20 which is connected to the receiver unit 10 from FIG. 1. Furthermore, it is connected to a detection unit 28. In turn, the detection unit 28 is connected to a verification unit 27.

In this context, the detection unit 28 contains a memory unit 21 which is connected to the transform unit 20. The memory unit 21 is further connected to a power-determining unit 22 which is connected in turn to a filter unit 23. The filter unit 23 is connected to a maxima-determining unit 24 which is connected in turn to a channel-determining unit 29. The channel-determining unit 29 accordingly contains an addition unit 25 which is connected to the maxima-determining unit 24 and a memory 26 which is connected to the addition unit 25. In turn, the memory 26 is connected to the verification unit 27. In this context, the elements 20, 21, 22, 23, 24, 25, 26 and 27 contained by the processor in FIG. 2 are designated jointly as the channel detector 40.

The digitised signal 30, which preferably comprises I/Q-sampled values, is transmitted by the receiver unit 10 to the transform unit 20. The transform unit 20 transforms the signal 30 into the frequency domain and in this manner generates the signal in the frequency domain 31.

$$X(k) = \sum_{n=0}^{N_{DFT}-1} x(n) * \exp\left(-j*2*\pi*\left(k+\left\lceil\frac{N_{DFT}}{2}\right\rceil\right)*n/N_{DFT}\right)$$

In this context, X(k) is the signal in the frequency domain 31, x(n) is the signal in the time domain, k is the frequency index and NDFT is the window length of a discrete Fourier transform which is used for the transformation of the signal into the frequency domain.

The signal in the frequency domain 31 is supplied to the memory unit 21 and buffered by the latter. A signal 32 read out from the memory unit 21, which, in content, corresponds completely with signal 31, is supplied to the power-determining unit 22 which determines and outputs the power of every sampled value of the signal 32 as the signal 33. In an alternative exemplary embodiment, the memory unit 21 is dispensed with. The signal 31 is then supplied directly to the power-determining unit 22.

The resulting signal 33 is transmitted to the filter unit 23. This determines a moving-average of the signal 33 and outputs it as the signal 34.

$$Y(k) = \begin{cases} 0 & 0 \le k < L-1 \\ \sum_{r=0}^{L-1} |X|^2(k-r) & L-1 \le k \le N_{DFT}-1 \end{cases}$$

In this context, Y(k) corresponds to the moving-average 34 of the signal 33, r is an index of the average formation, k is the frequency index described above.

The maxima-determining unit 24 is supplied with the signal 34 and, in the case of one active channel, determines the maximum, and, in the case of several active channels, the maxima in the signal 34 together with associated frequency indices Kmax(k) and outputs these (Kmax(k)) as the signal 35 to the channel-determining unit 29.

$$k_{max}(k) = \operatorname*{argmax}_{0 \le n \le k}\{Y(n)\}$$

In this context, Kmax(k) is the frequency index at the maximum value of Y(k) occurring up to the frequency index k, so that the following applies:

$$Y(n) \le Y(k_{max}(k)) \text{ for all } n \le k.$$

On the basis of the frequency indices $k_{max}(k)$ associated with the maxima which are displayed by the signal 35, the channel determining unit 29 now determines the active channels or respectively the active channel. From the frequency indices at which the maxima or respectively the maximum were/was detected, the addition unit 25 initially subtracts half of the window length L of the moving-average filter in order to compensate the delay through the average filter. A resulting signal 36 addresses the memory 26 in which, for every frequency index k (0<=k<=NDFT−1), the associated channel number (0<=channelnumber<=Nchannels−1) is stored (dependent upon channel bandwidth, one channel comprises several frequency indices). In this manner, the active channel or channels is/are determined. For this purpose, the associated channel number is read out from the memory for every frequency index associated with a detected maximum.

Optionally, the memory 26 can output the channels or respectively the channel determined in this manner directly as a result. Alternatively, a verification of the result is implemented by the verification unit 27. That is, the verification unit 27 checks whether the entire spectrum to be investigated has been investigated and, only after this, marks a determined channel as valid. The verification unit can optionally implement further checks, for example, whether a detected maximum is high enough to provide an adequate significance in order to count as an active channel.

In particular, the measuring device can be used to determine which PRACH channel is currently being used in the case of LTE TDD. In this context, the number of potential channels is unambiguously specified. The frequencies of the channels are known through the standard. In order to receive the PRACH channel, it must first be determined on which channel it is being transmitted.

In an exemplary LTE cell, the following configuration is present:
Cell bandwidth=15 MHz
PRACH configuration index=57
UL/DL configuration=3
In the case of the PRACH configuration index 57 the following applies
Nchannels=6
The following receiver configuration is used:
Sampling frequency fs=30.72 MHz
NDFT=1024
L=36
Offset=L/2=18
In this context L is the window length of the moving-average filter. L is selected to fit the signal bandwidth:

$$L = \frac{B * N_{DFT}}{fs} = \frac{1.08 * 1024}{30.72} = 36$$

B is the channel bandwidth, fs is the sampling frequency.

The detected channel number addresses a memory in which, for every possible channel number, the associated physical frequency is stored.

Figure 3:
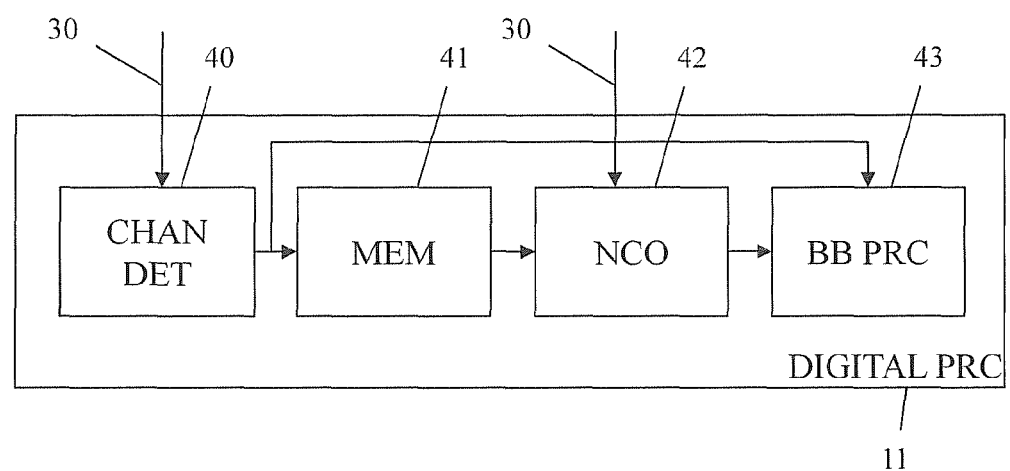
FIG. 3 a block-circuit diagram of a second exemplary embodiment of the measuring device according to one embodiment.

FIG. 3 shows an exemplary embodiment of the measuring device according to the invention in which this frequency is used in order to mix down the PRACH signal (for example, by means of a numerically controlled oscillator (NCO)) which is necessary for the downstream reception, since the downstream receiver generally expects a given frequency position. This method for determining the mixing frequency offers the advantage that the determined mixing frequency is exact, provided the channel has been correctly determined. Classical methods for determining the mixing frequency attempt to estimate the frequency directly, which is always associated with estimation errors. Furthermore, a direct estimation of the frequency is considerably more sensitive to channel impairments than the detection of the channel.

Accordingly, FIG. 3 shows only the processor 11. Here, it contains the channel detector 40, illustrated in detail in FIG. 2, and connected to the latter a memory 41, in which frequencies associated with the possible channels are stored. A numerically controlled oscillator 42, which is connected in turn to a baseband processor 43, is also connected to the memory 41. The channel detector is further connected to the baseband processor 43.

As shown on the basis of FIG. 2, the channel detector 40 determines at least one active channel from the possible channels. For every determined active channel, the procedure is as follows. The channel detector communicates the corresponding channel number to the memory 41. On the basis of this channel number, the memory 41 communicates the frequency of the channel to the numerically controlled oscillator 42 which generates an oscillator signal on this basis in order to mix down the signal 30. A digital numerically controlled oscillator 42 is shown here, which is supplied with a digital signal 30. However, as an alternative, the numerically controlled oscillator 42 could also operate in an analog manner and be supplied with the received signal still present in an analog form.

The numerically controlled oscillator 42 communicates a resulting mixed-down signal to the baseband processor 43 which further processes the signal in the baseband. Furthermore, the channel detector 40 communicates to the baseband processor 43 a verification signal which communicates to the baseband processor 43 that the determined channel is valid. The result of the verification unit 27 from FIG. 2 can be used for this purpose. A further processing by the baseband processor 43 takes place only in the case of a valid channel.

Optionally the memory 41 and the memory 26 from FIG. 2 are configurable. That is, during running operation, the memories 26, 41 can be reconfigured since their contents are dependent upon parameters, for example, the PRACH configuration index, which can vary during operation.

Figure 4:
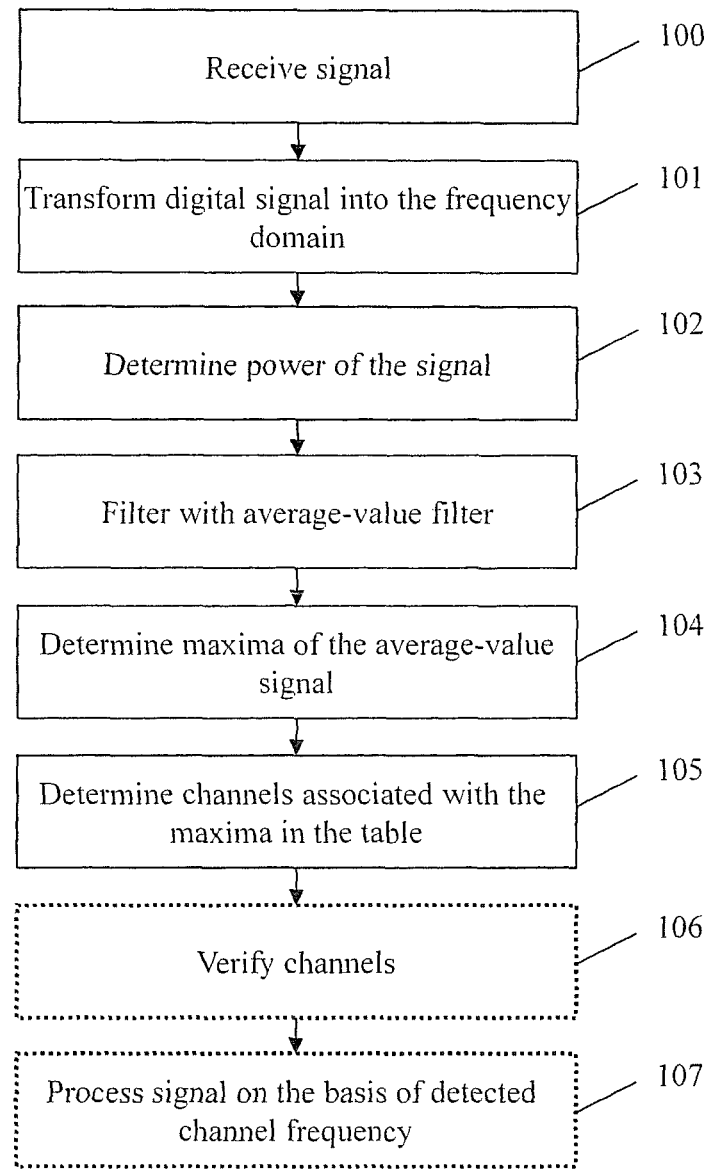
FIG. 4 an exemplary embodiment of the measuring method according to one embodiment in a flow chart.

Finally, FIG. 4 shows an exemplary embodiment of the measuring method according to the invention. In a first step 100, a signal is received and digitised. This is also associated, for example, with a conversion into the baseband. In a second step 101, the digital signal is transformed into the frequency domain. This can be implemented, for example, by means of discrete Fourier transform. In a third step 102, the power of the resulting signal in the frequency domain is determined. In a fourth step 103, the signal in the frequency domain is filtered. In this context, a moving-average filter is used. In a fifth step 104, a maximum of the average signal is determined. In a sixth step 105, active channels associated with the frequency indices of the maxima are determined by means of a memory.

In an optional seventh step 106, the determined channels are verified. That is for example, a check carried out to establish whether the determined maxima are sufficiently high to deliver an adequately significant indication of an active channel.

In a further optional step 107, the information obtained is now used for the further processing of the original signal. For example, the frequency of the channel determined can be used in order to mix down the signal.

The invention is not restricted to the exemplary embodiment illustrated. As already mentioned, an extremely diverse range of signals can be processed. For example, it is conceivable to use the method in the case of a radio receiver or television receiver, initially in order roughly to search the entire spectrum coming into question for available channels, and then to determine the exact frequency of the channels with a conventional fine-tuning method. Furthermore, a transmitter-search run which determines the strongest available channel within a band and then selects the latter would also be conceivable. The switching of the bands could be implemented by means of a conventional method (RF tuner). The frequencies of the transmitters within one band can be stored in a memory (compare exemplary embodiment above), which is addressed by the detected channel number. Advantageously, all of the features described above and features shown in the drawings can be combined arbitrarily with one another within the scope of the invention.

The invention claimed is:

1. A measuring device for determining an active channel from a plurality of channels of known frequencies in a signal, the measuring device comprising:
   a processor, wherein the processor contains:
      a frequency domain transformer for the transformation of a digital signal derived from the signal to form a signal in the frequency domain, and a detector for the detection of the active channel in the signal in the frequency domain,
wherein the detector comprises a filter which is embodied to form a moving-average of a signal derived from the signal in the frequency domain,
wherein the detector comprises a maxima determiner which is embodied to determine the frequency index of a maximum and a maximum of the moving-average, and
wherein the detector comprises a channel-determiner which is configured to determine the active channel by memory on the basis of the frequency index of the maximum of the moving-average.

2. The measuring device according to claim 1,
wherein the detector comprises a power determiner, which is configured to determine the power of the signal in the frequency domain, and
that the signal processed by the filter derived from the signal in the frequency domain is the power of the signal in the frequency domain.

3. The measuring device according to claim 1,
wherein the measuring device further contains a receiver which is configured to:
receive the signal, and
digitize the signal to form the digital signal.

4. The measuring device according to claim 1,
wherein the processor further comprises a verifier configured to:
check whether a total spectrum to be investigated has been investigated, and
establish whether the determined active channel is valid.

5. The measuring device according to claim 1,
wherein the signal is an LTE signal, and
that the active channel is an LTE TDD PRACH channel.

6. The measuring device according to claim 1,
wherein the measuring device comprises memory for the determination of a frequency associated with the determined active channel, and
that the measuring device comprises an oscillator for the mixing down of the signal or of a signal derived from the signal with an oscillator signal of the frequency associated with the active channel.

* * * * *